United States Patent
Mougel et al.

(10) Patent No.: US 9,805,969 B2
(45) Date of Patent: Oct. 31, 2017

(54) CALIBRATION METHOD FOR HEAT TREATMENT UNITS

(71) Applicant: Soitec, Bernin (FR)

(72) Inventors: Sebastien Mougel, Saint Martin d'Heres (FR); Didier Masselin, Le Cheylas (FR)

(73) Assignee: Soitec (FR)

( * ) Notice: Subject to any disclaimer, the term of this patent is extended or adjusted under 35 U.S.C. 154(b) by 0 days.

(21) Appl. No.: 15/153,509

(22) Filed: May 12, 2016

(65) Prior Publication Data

US 2016/0336215 A1 Nov. 17, 2016

(30) Foreign Application Priority Data

May 13, 2015 (FR) ..................... 15 54322

(51) Int. Cl.
*H01L 21/762* (2006.01)
*H01L 21/324* (2006.01)
*H01L 21/66* (2006.01)
*H01L 27/12* (2006.01)
*H01L 21/67* (2006.01)

(52) U.S. Cl.
CPC ........ *H01L 21/7624* (2013.01); *H01L 21/324* (2013.01); *H01L 21/67248* (2013.01); *H01L 21/76254* (2013.01); *H01L 22/20* (2013.01); *H01L 27/1229* (2013.01); *H01L 27/1266* (2013.01)

(58) Field of Classification Search
None
See application file for complete search history.

(56) References Cited

U.S. PATENT DOCUMENTS

| 5,618,461 A | 4/1997 | Burke |
| 5,783,804 A | 7/1998 | Burke |

(Continued)

FOREIGN PATENT DOCUMENTS

WO 2014072109 A1 5/2015

OTHER PUBLICATIONS

Kononchuk et al., Novel Trends in SOI Technology for CMOS Applications, Solid State Phenomena, vols. 156-158, (2010) pp. 69-76 (abstract only).

*Primary Examiner* — Angel Roman
(74) *Attorney, Agent, or Firm* — TraskBritt (57) ABSTRACT

A calibration method for determining temperature set point corrections to be applied to the nominal temperature set points of each of the N heating zones of a heat treatment unit having L substrate locations, includes the following steps: establishing a sensitivity model linking variations of a substrate characteristic at each of M representative locations of the L locations to temperature set point variations applied in each of the N heating zones, the variations respectively reflecting differences with respect to a target characteristic and with respect to the nominal set points; executing the process in the heat treatment unit and on the basis of nominal set points; measuring the substrate characteristic at least at a representative measurement location of each heating zone of the unit to supply M measurements; and determining temperature set point corrections from the sensitivity model, the measurements and the target substrate characteristic.

18 Claims, 3 Drawing Sheets

(56) References Cited

U.S. PATENT DOCUMENTS

2008/0142508 A1\* 6/2008 Jyousaka ........... G05D 23/1931
219/483
2012/0170609 A1\* 7/2012 Gurary ................. G01J 5/0003
374/2

\* cited by examiner

CALIBRATION METHOD FOR HEAT TREATMENT UNITS

PRIORITY CLAIM

Pursuant to 35 U.S.C. §119(a), this application claims the benefit of the filing date of French Patent Application No. 1554322, filed May 13, 2015, for "Calibration Method for Heat Treatment Units."

FIELD OF THE INVENTION

The present invention concerns the field of microelectronics and microtechnologies.

The invention more particularly concerns heat treatment processes and in particular heat treatments applied to silicon or SOI (Silicon-On-Insulator) wafers.

BACKGROUND

Microelectronic heat treatment methods that make possible production of various layers (for example, of silicon oxide) or the surface treatment of substrates address increasingly severe uniformity parameters.

In fact, the evolution of microelectronics implies reducing the characteristic dimensions of components with the aim of improving both the integration density and the speed of the circuits. In parallel with this, the diameter of the silicon and/or SOI wafers is increasing, going from 200 mm to 300 mm and even 450 mm, with the aim of fabricating ever more dies per wafer. The requirement is therefore to obtain ever finer layers, of ever more controlled and uniform thickness over ever larger areas.

Heat treatment methods are thus confronted with the non-uniform nature of the reactions taking place within the reactor of the unit. This lack of uniformity can have a number of causes:
- the intrinsic non-uniformity of the equipment, linked, for example, to the non-uniform power of the heating zones, to the intrinsic accuracy of the temperature sensors, to the shape of the reactor, to the variable gas flows, etc.
- the variation of the kinetics of the reaction expected in the reactor through the dilution effect (i.e., impoverishment of the reagent(s)), or the inhibiting effect (i.e., the increasing concentration of the reaction residues).

The heat treatment units usually employed in the microelectronics industry consist of reactors of large size able to contain a large quantity of substrates (commonly up to 200 substrates). Because of their dimensions, this type of unit includes a plurality of heating elements disposed regularly along the reactor. The heating elements define a plurality of heating zones.

The temperature set points applied to each of the heating zones of a heat treatment unit define a process that aims to establish a target substrate characteristic. This target substrate characteristic may be a particular layer thickness (for example, of an oxide layer) or a surface roughness value below a particular threshold.

For the methods that are the most demanding in terms of the substrate characteristic, it is common to apply set point corrections in each of the heating zones during the initial optimization of the method or between two implementations of the method if "drift" in the characteristic is observed. This correction step is generally referred to as "calibration."

One calibration method typically used is based on an empirical relation globally linking the temperature and the substrate characteristic in question. Accordingly, when the substrate characteristic is a thickness of an oxide layer generated during the heat treatment, it is established empirically that, for a given method, a particular temperature difference $\Delta T$, with respect to the nominal temperature, generates an oxide thickness difference $\Delta X$. If drift in the substrate characteristic is observed after the execution of a process, the operator applies approximate corrections to the temperature set points of all the heating zones, based on this global relation, so as to compensate for that drift. This purely manual method depends on the assessment by the operator responsible for the calibration of the unit: depending on the $\Delta X$ measured on the wafers treated in different positions of the furnace, the correction value $\Delta T$ applied can vary depending on the experience of the operator. Recent demanding microelectronics processes cannot tolerate a level of approximation as to the result obtained because the yield of the operation is greatly impacted by the variance in the corrections implemented by the operator.

Moreover, such a correction process does not function perfectly. In fact, it does not take account of the fact that the heating zones are not independent of one another. Applying a $\Delta T_1$ to a first heating zone can impact one or more heating zones i of the unit. The greater the set point corrections, the more the mutual influence of the heating zones will interfere with the final result by generating a significant difference versus the result expected by the operator following their temperature set point corrections.

The present disclosure aims to remedy the various drawbacks of the prior art described above.

One object of the present disclosure is to provide a reliable method of calibrating a process employed in a heat treatment unit.

Another object of the present disclosure is to provide an automated calibration method in order to render it more industrial and compatible with high-volume production requirements.

BRIEF SUMMARY

The present disclosure concerns a calibration method for determining temperature set point corrections to be applied to nominal temperature set points of each N heating zone of a heat treatment unit having L substrate locations, the heat treatment unit and the nominal temperature set points defining a method aimed at establishing a substrate target characteristic, the method being characterized in that it includes the following steps:
- establishing a sensitivity model linking variations of the substrate target characteristic at each M representative location of the L substrate locations to temperature set point variations applied in each of the N heating zones, the variations respectively reflecting differences with respect to the substrate target characteristic and with respect to the nominal temperature set points;
- executing the process in the heat treatment unit and on the basis of the nominal temperature set points;
- measuring the substrate characteristic at least at a representative measurement location of each heating zone of the heat treatment unit to supply M measurements; and
- determining temperature set point corrections from the sensitivity model, the measurements and the target substrate characteristic.

In accordance with advantageous features of the invention, separately or in combination:

the determination step is followed by a step of executing the process in the heat treatment unit on the basis of the nominal set points corrected by the temperature set point corrections;

the set point corrections are defined as the set point variations, which when applied to the model, lead to compensation of the difference between the measurements and the target characteristic;

the step of determining the set point corrections is executed when the difference between the measurements and the target characteristic is above a particular threshold;

the sensitivity model is established by application of the same temperature set point variation separately and successively in each heating zone, the other heating zones being maintained at their nominal set points;

the sensitivity model includes a sensitivity matrix $S_{ij}$ determined by:

$$S_{ij} = \frac{(\Delta X_{\Delta T_i})_j}{\Delta T_i},$$

where $1 \leq t \leq N$ and $1 \leq j \leq M$, and $(\Delta X_{\Delta T_i})_j$ is the variation of the substrate characteristic X situated at a measurement location j of the heat treatment unit for a temperature variation $\Delta T_i$ applied to the heating zone i;

the sensitivity model includes a gains matrix $G_{ij}$ defined on the basis of the normalized sensitivity matrix in accordance with the equation:

$$G_{ij} = S_{ij} \times \frac{1}{S_j},$$

wherein the normalization matrix is $$S_j = \frac{(\Delta X_{\Delta T_N})_j}{\Delta T_N},$$

where:

$(\Delta X_{\Delta T_N})_j$ is the variation of the substrate characteristic X situated at a measurement location j of the heat treatment unit for a temperature variation $\Delta T_N$ applied to the N heating zones;

the standardization matrix is $S = \overline{S}_j$, where $\overline{S}_j$ is the mean of the terms of $S_j$ over all the measurement locations j of the heat treatment unit;

determining the set point corrections includes minimizing the residue $r_j$ in accordance with the equation:

$$r_j = G_{ij} \times (T_{corr})_i - \frac{\Delta X_j}{S_j},$$

in which:

$(T_{corr})_i$ is the temperature set point correction to be applied in the heating zone i;

$\Delta X_j$ is the difference between the measurement at a measurement location j of the heat treatment unit and the target characteristic;

determining the set point corrections includes minimizing a global residue R defined as the sum of the squares of the residue $r_j$ for each measurement location j of the heat treatment unit;

the set point corrections are automatically sent to the control interface of the heat treatment unit on starting the process.

The calibration method, in accordance with the present disclosure, therefore makes possible automatic determination of the set point corrections to be applied in the event of drift in a heat treatment process based on a sensitivity model established beforehand for the unit and the process concerned.

This method does not depend on assessment by a person operating the heat treatment unit and takes into consideration the mutual influence of the various heating zones of the heat treatment unit.

This calibration method is compatible with industrial control and management of an installed equipment base comprising a plurality of heat treatment units in a high-volume production environment.

In accordance with other advantageous features of the present disclosure, separately or in combination:

the measured value of the substrate characteristic is a measurement point on the substrate or a mean of measurement points on the substrate;

the substrate characteristic is a thickness of an oxide layer generated on the substrate during the process;

the substrate characteristic is a thickness of a buried oxide layer of an SOI substrate dissolved during the process;

the substrate characteristic is a thickness of a buried oxide layer of an SOI substrate remaining after the process;

the substrate characteristic is the surface roughness of the substrate obtained after the process.

BRIEF DESCRIPTION OF THE DRAWINGS

The present disclosure will be better understood after reading the following description and examining the drawings that accompany it. These drawings are provided only by way of non-limiting illustration of the present disclosure.

DETAILED DESCRIPTION

Figure 1A:
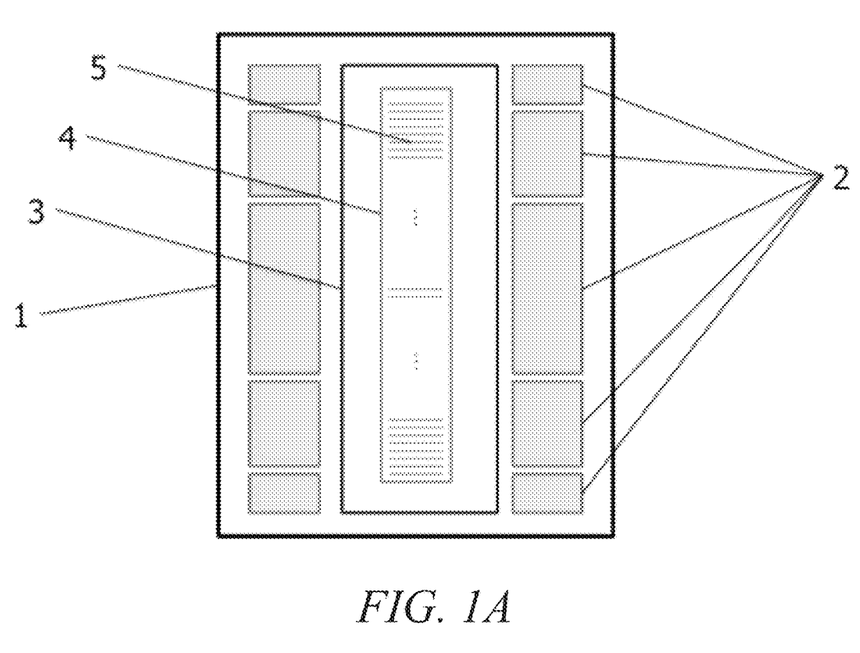
FIG. 1A is a simplified illustration of a heat treatment unit including a plurality of heating zones and a plurality of substrate locations.

Referring to FIG. 1A, a heat treatment unit 1 usually includes a reactor 3 of large size in which a loading support 4 is able to receive a large number of substrates to be treated: it will hereinafter be considered that the number of substrate locations 5 is L. In horizontal or vertical furnaces, the number L of substrate locations 5 can range from 50 to 200.

The size of the reactor 3 also imposes having a plurality of heating zones 2 along the reactor 3 in order to be able to adjust the temperature set points more precisely and to obtain more uniform temperature profiles throughout the length of the reactor 3, i.e., for all the L substrate locations 5. It will hereinafter be considered that the number of heating zones 2 at the level of the reactor 3 of the furnace is N. The number N of heating zones 2 usually varies from 3 to 6.

Figure 1B:
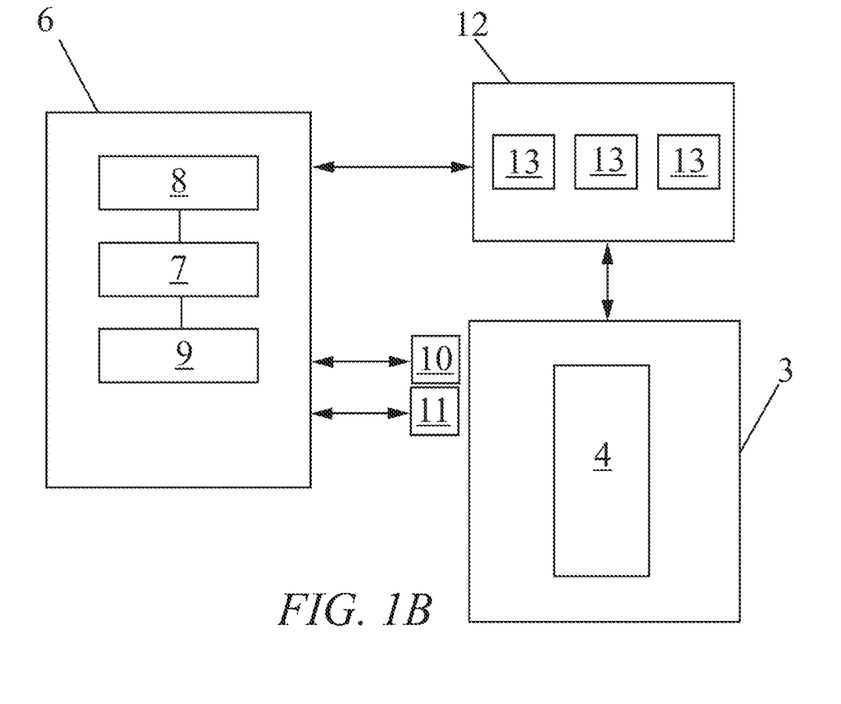
FIG. 1B is a block diagram illustrating various components of the heat treatment unit of FIG. 1A.
Figure 2A:
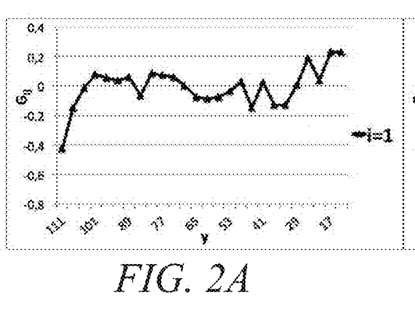
FIGS. 2A-2E are graphs representing gains established at each measurement location j for a temperature set point variation applied separately and successively to each heating zone i, defined for a given process in a heat treatment unit.
Figure 2B:
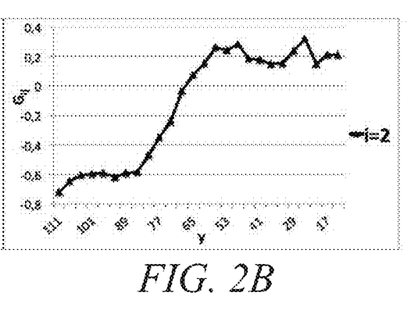
Figure 2C:
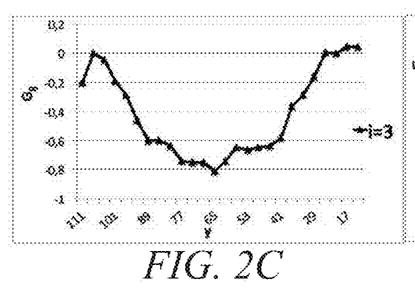
Figure 2D:
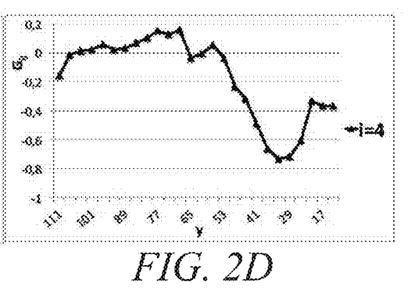
Figure 2E:
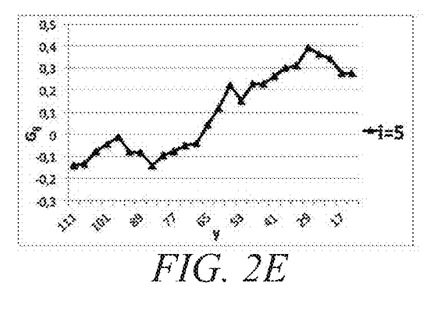

FIG. 1B is a block diagram illustrating various components of the heat treatment unit 1. The heat treatment unit 1 includes the reactor 3, and a control system 6. The control system 6 may include, for example, a computer or a programmable logic controller that is configured under control of software to control operation of the various active components of the heat treatment unit 1. For example, the control system 6 may include a microprocessor 7, memory 8, and one or more input/output devices 9 (e.g., a touchscreen, keyboard, display, etc.). The control system 6 may be operatively coupled to heating elements 10 and thermocouples 11 within or associated with the reactor 3 so as to monitor and control the temperature in the various heating zones 2. The heat treatment unit 1 may further include a measurement unit 12 including one or more sensors 13 located and configured to measure one or more characteristics of a substrate or substrates processed by the heat treatment unit 1, as discussed in further detail herein below. In some embodiments, the one or more sensors 13 may be located and configured to measure the substrate characteristics in situ while the substrates are disposed within the loading support 4 during processing of the substrates within the reactor 3.

Every heat treatment process aims to establish a substrate target characteristic. For example, a given process might target the formation of an oxide layer having a thickness of 200 nm on a silicon substrate. Thus, the substrate target characteristic in this instance is the 200 nm oxide layer thickness.

The heat treatment process is also characterized by the temperature, gas flows and time parameters defined and stored in the settings of the furnace in relation to that process. For example, a given process is an oxidation process at 950° C. including raising and lowering the temperature at the rate of 5°/min in an argon neutral atmosphere and holding the temperature at 950° C. for 30 minutes in a humid oxidizing atmosphere. When the process is established, nominal parameters are defined that make it possible to obtain the substrate target characteristic at all the L substrate locations. These nominal parameters notably include nominal temperature set points for each of the N heating zones.

As for any process, it is usual to define thresholds or limits beyond which the substrate characteristic produced by the process is no longer as required and necessitates a new calibration of the settings. These limits are usually called control limits. The control limits make it possible to react rapidly when faced with natural or unusual drift of the heat treatment unit.

After a heat treatment process has been carried out, a step of measuring the substrate characteristic is effected to establish the performance of the process. This step makes it possible to verify that the characteristic is still on target, i.e., within the control limits defined for the process. The measurement step may be carried out on all the treated substrates coming from the L locations distributed along the length of the reactor. To limit the duration of this step, the measurement is advantageously carried out on a more limited number M of treated substrates. The M measurement locations are selected so that the measurement profile obtained is representative of the performance of the process as regards the substrate characteristic over the entire length of the reactor. The M substrates measured are advantageously also taken from locations of the furnace representative of the N heating zones. The M locations will typically be regularly distributed over all the length of the reactor.

If drift in the substrate characteristic is observed after carrying out a process, it is necessary to determine the temperature set point corrections to be entered into the unit before the process is launched again to compensate the drift and to return to the target characteristic.

The calibration method, in accordance with the present disclosure makes it possible to determine the temperature set point corrections to be applied to the nominal set points of each of the N heating zones of a heat treatment unit having L substrate locations.

The first step of this method consists in establishing a sensitivity model for a given process linking, for each of the M measurement locations, variations of the substrate characteristic to temperature set point variations applied individually in the N heating zones.

The process generating the substrate target characteristic is initially defined by nominal parameters including temperature set points in each of the N heating zones. A temperature set point variation $\Delta T$ is applied in a first heating zone, the other heating zones retaining their own nominal set point. This process is applied to substrates distributed between the L locations of the reactor or at least between the M measurement locations. These substrates usually constitute test substrates for establishing the sensitivity model. The substrate characteristic is then measured on the treated substrates. The measurement is advantageously effected on M substrates taken from locations of the furnace representative of the N heating zones, M being less than or equal to L. The M measurement locations chosen are also representative of the entire length of the reactor, i.e., representative of the L locations of the reactor. For example, twenty-five measurement locations will be chosen uniformly distributed over all the length of the reactor, comprising one hundred fifty locations.

Comparing the M measurements of the substrate characteristic X to the target characteristic obtained with the nominal parameters makes it possible to calculate the variation $\Delta X$ of the characteristic at each of the M locations measured for a temperature set point variation $\Delta T$ in the first heating zone, the other heating zones retaining their nominal set points.

This first series of variation data linking the variations of the substrate characteristic X at M locations of the furnace to the temperature set point variation applied individually in the first heating zone makes it possible to feed the sensitivity model.

A second series of data is then generated, this time by applying the temperature set point variation in a second heating zone, all the other zones retaining their own nominal set points, and repeating the process and the subsequent measurement. The same goes for each heating zone i, i being between 1 and N inclusive.

At this stage it is possible to define for a given process a so-called sensitivity matrix $S_{ij}$ comprising i rows (i being between 1 and N) and j columns (j being between 1 and M), including N×M terms defined by:

$$S_{ij} = \frac{(\Delta X_{\Delta T_i})_j}{\Delta T_i}$$

Each term of the sensitivity matrix is therefore the ratio between the variation of the characteristic $(\Delta X_{\Delta T_i})_k$ at the location j induced by the temperature set point variation of the heating zone i and the set point variation $\Delta T_i$.

This sensitivity matrix constitutes one of the important elements of the sensitivity model.

Another constitutive element of the sensitivity model is the normalization matrix, which is also dependent on the process. To establish the normalization matrix, the temperature set point variation $\Delta T$ is simultaneously applied in all the N heating zones and the process and the M measurements of the substrate characteristic are repeated.

This makes it possible to obtain the variation of the characteristic at each of the M locations measured for the temperature set point variation $\Delta T$ simultaneously applied in the N heating zones. The normalization matrix $S_j$ comprising j columns (j being between 1 and M) includes M terms defined by:

$$S_j = \frac{(\Delta X_{\Delta T_N})_j}{\Delta T_N}$$

Each term of the normalization matrix is, therefore, the ratio between the variation of the characteristic $(\Delta X_{\Delta T_N})_j$ at the location j induced by the temperature set point variation in the N heating zones and the set point variation $\Delta T_N$.

The sensitivity and normalization matrices defined for a given process are used to establish the gain matrix, the ratio between these two matrices, defined by:

$$G_{ij} = S_{ij} \times \frac{1}{S_j}$$

This dimensionless gain matrix reflects the impact of set point variations in the various heating zones on the profile of the characteristic for a given process: in the present context the profile is defined by the values of the characteristic X of substrates from the M measurement locations over the whole of the length of the reactor of the heat treatment unit.

The higher the amplitude of the gain (with a value greater than or less than 0) at a given substrate location, the more a temperature set point variation applied in the heating zone concerned induces a strong variation in the characteristic of the substrate treated in the given location.

At this stage, the constitutive elements of the sensitivity model for a given process have been established.

After the execution of the process and the subsequent measurement of the substrate characteristic, if a drift in the substrate characteristic is observed, i.e., if the difference between the characteristic measured at at least one location j and the target characteristic is greater than the control limit defined for that process, the step of the calibration method in accordance with the invention of determining set point corrections is executed.

That step consists in comparing the characteristic drift profile and a characteristic variation profile based on the gain matrix coupled to variable set point variations. This relies on the following relation:

$$r_j = [B] - [A] = [G_{ij} \times (\Delta T_{corr})_i] - \left[\frac{\Delta X_j}{S_j}\right]$$

The term A corresponds to the characteristic drift profile, in which $\Delta X_j$ is the difference between the measurement at a measurement location j of the heat treatment unit and the target characteristic; that difference is normalized by the normalization matrix $S_j$ defined above.

The term B corresponds to the characteristic variation profile based on the gain matrix $G_{ij}$ coupled to variable set point variations $(\Delta T_{corr})_i$ in each heating zone i.

The objective is to minimize the residue $r_j$ between these two terms by causing $(\Delta T_{corr})_i$ to vary, i.e., by testing different combinations of set point variations that, according to the gain matrix established for the process, would make it possible to compensate for the difference between the measured characteristic and the target characteristic at each location j.

To define optimum set point variations for the M substrate locations, the residue minimization calculation is effected on the global residue R defined as being the square of the residue $r_j$ at each location j. The optimum set point variations $(\Delta T_{corr})_i$ obtained represent the temperature set point corrections to be applied in the heating zones i. This is the result of the determination step of the calibration method.

In accordance with a first embodiment, the step of determination of the corrections is obtained with software implementing a numerical optimization method well known in itself (for example, the gradient method). Following the measurement of the substrate characteristics, the operator enters the reference of the process used and the measurements obtained into the control system of the heat treatment unit, and launches a calculation program executed by the control system for carrying out this correction determination step. The program notably includes the predefined gain matrix for the process. The corrections to be applied in the N heating zones are displayed on the screen, enabling the operator to enter them into the control system of the heat treatment unit.

In accordance with a second embodiment, the corrections determined by the software during this determination step are automatically sent from the software interface to the control interface of the heat treatment unit, avoiding any manual input by the operator.

Finally, in accordance with a third embodiment, an automation system connects the various units: the heat treatment unit, the measuring unit and the software interface for carrying out the correction determination step. The substrates treated, often grouped into batches of twenty-five, are measured. The bar code of each batch carries the process information via the manufacturing execution system (MES). An automatic control step is executed after the measurement, verifying the difference between the value of the characteristic obtained and the target characteristic. If the difference is outside fixed control limits, a routine launches the calculation software, the measurement data is recovered from the measuring unit, the gain matrix relating to the process called (which is part of the information carried by the batch) is used. When the calculation is finished, the routine communicates the set point corrections to the control interface of the furnace.

Example 1

The usual finishing treatments applied to SOI substrates include smoothing annealing treatments consisting in exposing the top layer of silicon to a neutral or reducing atmosphere at a high temperature, typically above 1100° C. Among other things, by surface reconstruction, this treatment makes it possible to reduce the roughness of the layer exposed to the high-temperature atmosphere.

By virtue of an oxide dissolving effect, this treatment also modifies the characteristics of the underlying dielectric layer, such as its thickness. This phenomenon is notably reported in the document "Novel Trends in SOI Technology for CMOS applications," by O. Kononchuck et al., published in the journal *Solid State Phenomena*, vol. 156-158 (2010) pp. 69 to 76, the contents of which are incorporated herein in their entirety by this reference. That document, in fact, explains that, in the high-temperature neutral or reducing treatment atmosphere, the oxygen atoms of the dielectric layer are liable to diffuse through the top layer and to react with the surface thereof to produce volatile species that are evacuated by the atmosphere of the furnace.

Of the various substrate characteristics verified after this type of treatment, an important one is the loss of thickness of the buried oxide of the SOI structure.

The loss of thickness of the buried oxide is measured at a number of points on the treated substrate, for example, at 40 points. A mean value is extracted from these measurements and corresponds to the substrate characteristic verified for this process. It must typically be between control limits defined for that process in accordance with a normal +/−3 sigma law well known to the person skilled in the art.

In the type of heat treatment unit considered for this process, the number of substrate locations is typically one hundred fifty and the number of heating zones is typically five, as shown in FIG. 1A.

The sensitivity model is produced on the basis of twenty-five measurement locations radially distributed all along the reactor of the furnace and correctly representing the five heating zones.

The sensitivity and normalization matrices have been defined for a temperature set point variation $\Delta T$ equal to 3° C. This variation has been chosen because it corresponds to the range of correction expected for this type of process; thus the sensitivity model is produced in the appropriate variation range and ensures better accuracy.

FIGS. 2A-2E are graphs representing the gain matrix obtained for this process. The gain is plotted on the ordinate axis for each measurement location plotted on the abscissa axis. Each curve of FIGS. 2A-2E represents the gain obtained on application on a temperature set point variation of 3° C. in a given heating zone i (i from one to five). For example, the curve of FIG. 2B corresponds to the application of the temperature set point variation in the second heating zone (i=2), the other heating zones having retained their own nominal set points.

The greater the amplitude of the gain (with a value greater than or less than 0) at a given substrate location, the more a temperature set point variation applied in the heating zone concerned induces a strong variation in the characteristic of the substrate treated at the given location.

Figure 3:
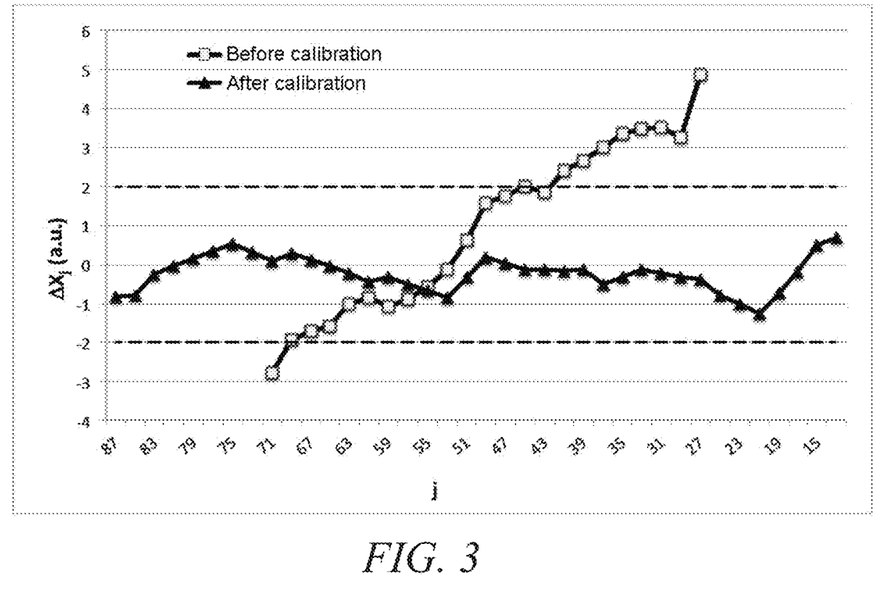
FIG. 3 illustrates a measurement profile for the substrate characteristic X obtained from M locations, after a given process in the heat treatment unit (referred to as "before calibration"), and measurement profile for the same substrate characteristic X obtained from the M locations after application to the process of the calibration method in accordance with the present disclosure ("after calibration").

FIG. 3 illustrates a situation of drifting of the substrate characteristic for the dissolution process concerned. The curve with empty squares shows a significant difference between the measured oxide thickness loss and the target oxide thickness loss (plotted in arbitrary units on the ordinate axis) at a plurality of measurement locations. This difference is greater than the control limits defined for this process (shown in dashed line).

The calibration method in accordance with the present disclosure is then applied to determine the temperature set point corrections to be applied to compensate for this difference and to return to the control limits of the process, as closely as possible to the target characteristic: the resultant curve in FIG. 3 should therefore be as close as possible to zero.

The measured substrate characteristics are input into the calculation software which, using the gain matrix relating to the process concerned, produces the set point corrections making it possible to best compensate for the observed characteristic difference. Those corrections are then entered into the control interface of the heat treatment unit before launching a new process on a new series of substrates. Those substrates are measured on leaving the furnace. The curve with filled-in triangles in FIG. 3 shows the difference between the measured oxide thickness loss and the target oxide thickness loss: it is seen that this difference is uniform over the twenty-five locations measured and very close to 0 following application of the calibration method. In this case the substrate characteristic is on target and within the control limits defined for this process.

Example 2

Thermal oxidation is another usual type of heat treatment in the silicon and SOI field. To fabricate SOI substrates, notably by the SMART CUT® process, it is usual to grow a thermal oxide layer on at least one of the substrates to be assembled. That oxide layer will constitute the buried oxide layer of the final SOI structure.

The oxide thickness is measured at a plurality of points on the substrate after treatment, for example, at 40 points. A mean value is extracted from these measurements and corresponds to the substrate characteristic monitored for this process. It must typically be between control limits defined for this process in accordance with a normal +/−3 sigma law.

In the type of heat treatment unit considered for this process, the number of substrate locations is one hundred fifty and the number of heating zones is five.

The sensitivity model is produced on the basis of twenty-five measurement locations regularly distributed along the entire reactor of the furnace and correctly representing the five heating zones.

The sensitivity and normalization matrices have been defined for a temperature set point variation $\Delta T$ equal to 3° C. That variation has been chosen because it corresponds to the expected correction range for this type of process and the sensitivity model is therefore produced in the appropriate variation range and ensures better accuracy. The gain matrix can then be established.

In the case of a drift in the substrate characteristic for the oxidation process concerned, a significant difference greater than the control limit defined for this process is observed between the measured oxide thickness and the target oxide thickness.

The calibration method in accordance with the invention is then applied to determine the temperature set point corrections to be applied to compensate for this difference and to return to the control limits of the process, as close as possible to the target characteristic.

The characteristics are injected into the calculation software, which using the gain matrix relating to the process concerned, produces the set point corrections making it possible to best compensate for the observed difference in the characteristic. These corrections are then entered into the control interface of the heat treatment unit before launching a new process on a new series of substrates. Those substrates are measured on leaving the furnace.

After calibration, the substrate characteristic is on target, below the control limit defined for this process.

Example 3

This calibration method may also be applied to single wafer heat treatment units, such as RTA (Rapid Thermal Anneal) or RTP (Rapid Thermal Process) units, making possible, for example, surface smoothing processes at very high temperatures for very short times. In this situation, the reactor is not a tube of large size but a chamber able to accept a single wafer. The uniformity of heating is no less critical because the processes carried out in these units are carried out at very high temperatures, with very fast rises in temperature: the equally rapid reaction kinetics can generate large non-uniformities if the temperature at the substrate is not controlled. The heating elements consist of halogen lamps.

The substrate characteristic verified is the surface roughness measured by DRM (Differential Reflectance Microscopy), which is a technique based on the mutual dependence of the optical reflectivity of the layer and its thickness, as explained in the International Patent No. WO 2014/072109, the contents of which are incorporated herein in their entirety by this reference.

To define the sensitivity model, each heating element or group of heating elements is treated as a heating zone. The measurement locations correspond to different zones on the wafer being treated, covering all of the surface of the wafer.

The sensitivity and normalization matrices are defined for a temperature set point variation $\Delta T$ equal to 3° C. That variation is chosen because it corresponds to the correction range expected for this type of process and the sensitivity model is therefore produced in the appropriate variation range and ensures better accuracy. The gain matrix can then be established.

In the event of drift in the substrate characteristic for the single-wafer smoothing process concerned, a significant difference between the measured roughness and the target roughness above the control limit defined for this process is observed.

The calibration method in accordance with the invention is then applied to determine the temperature set point corrections to be applied to compensate for this difference and to return to the control limits of the process, as close as possible to the target characteristic.

The characteristics are input into the calculation software, which using the gain matrix relating to the process concerned, produces the set point corrections making it possible to best compensate for the observed characteristic difference. Those corrections are then entered into the control interface of the heat treatment unit before launching a new process on a new series of substrates. Those substrates are measured on leaving the furnace.

After calibration, the substrate characteristic is on target, below the control limit defined for this process.

The calibration method in accordance with the present disclosure may be applied to a number of other heat treatment processes to define automatically and accurately the temperature set point corrections to be applied in the various heating zones in the event that drift is observed in the characteristic of the treated substrate.

What is claimed is:

1. A calibration method for determining temperature set point corrections to be applied to nominal temperature set points of each N heating zone of a heat treatment unit having L substrate locations, the heat treatment unit and the nominal temperature set points defining a method aimed at establishing a substrate target characteristic, the method being characterized in that it includes the following steps:

establishing a sensitivity model linking variations of the substrate target characteristic at each M representative location of the L substrate locations to temperature set point variations applied in each of the N heating zones, the variations respectively reflecting differences with respect to the substrate target characteristic and with respect to the nominal temperature set points;

executing the process in the heat treatment unit and on the basis of the nominal temperature set points;

measuring the substrate target characteristic at least at a representative measurement location of each heating zone of the heat treatment unit to supply M measurements; and determining temperature set point corrections from the sensitivity model, the measurements and the substrate target characteristic.

2. The calibration method according to claim 1, wherein the temperature set point corrections are defined as the temperature set point variations which, applied to the model, lead to compensation of the difference between the measurements and the substrate target characteristic.

3. The calibration method according to claim 1, wherein the step of determining the temperature set point corrections is executed when the difference between the measurements and the substrate target characteristic is above a particular threshold.

4. The calibration method according to claim 1, wherein the sensitivity model is established by application of the same temperature set point variation separately and successively in each heating zone, the other heating zones being maintained at their nominal temperature set points.

5. The calibration method according to claim 1, wherein the sensitivity model includes a sensitivity matrix $S_{ij}$ determined by:

$$S_{ij} = \frac{(\Delta X_{\Delta T_i})_j}{\Delta T_i},$$

where $1 \leq i \leq N$ and $1 \leq j \leq M$, and $(\Delta X_{\Delta T_i})_j$ is the variation of the substrate target characteristic X situated at a measurement location j of the heat treatment unit for a temperature variation $\Delta T_i$ applied to the heating zone i.

6. The calibration method according to claim 5, wherein the sensitivity model includes a gains matrix $G_1$ defined on the basis of the normalized sensitivity matrix in accordance with the equation:

$$G_{ij} = S_{ij} \times \frac{1}{S_j},$$

wherein the normalization matrix is $$S_j = \frac{(\Delta X_{\Delta T_N})_j}{\Delta T_N},$$

where:

$(\Delta X_{\Delta T_N})_j$ is the variation of the substrate target characteristic X situated at a measurement location j of the heat treatment unit for a temperature variation $\Delta T_N$ applied to the N heating zones.

7. The calibration method according to claim 6, wherein the standardization matrix is $S=\overline{S}_j$, where $\overline{S}_j$ is the mean of the terms of $S_j$ over all the measurement locations j of the heat treatment unit.

8. The calibration method according to claim 7, wherein determining the set point corrections includes minimizing the residue $r_j$ in accordance with the equation:

$$r_j = G_{ij} \times (T_{corr})_i - \frac{\Delta X_j}{S_j},$$

in which:

$(T_{corr})_i$ is the temperature set point correction to be applied in the heating zone i;

$\Delta X_j$ is the difference between the measurement at a measurement location j of the heat treatment unit and the substrate target characteristic.

9. The calibration method according to claim 8, wherein determining the set point corrections includes minimizing a global residue R defined as the sum of the squares of the residue $r_j$ for each measurement location j of the heat treatment unit.

10. The calibration method according to claim 5, wherein determining the set point corrections includes minimizing the residue $r_j$ in accordance with the equation:

$$r_j = G_{ij} \times (T_{corr})_i - \frac{\Delta X_j}{S_j},$$

in which:

$(T_{corr})_i$ is the temperature set point correction to be applied in the heating zone i;

$\Delta X_j$ is the difference between the measurement at a measurement location j of the heat treatment unit and the substrate target characteristic.

11. The calibration method according to claim 1, wherein the measured value of the substrate target characteristic is a measurement point on the substrate or a mean of measurement points on the substrate.

12. The calibration method according to claim 1, wherein the substrate target characteristic is a thickness of oxide generated on the substrate during the process.

13. The calibration method according to claim 1, wherein the substrate target characteristic is a thickness of buried oxide of an SOI substrate dissolved during the process.

14. The calibration method according to claim 1, wherein the substrate target characteristic is a thickness of buried oxide of an SOI substrate remaining after the process.

15. The calibration method according to claim 1, wherein the substrate target characteristic is the surface roughness of the substrate obtained after the process.

16. The calibration method according to claim 1, wherein the set point corrections are automatically sent to a control interface of the heat treatment unit on starting the process.

17. The calibration method according to claim 2, wherein the step of determining the set point corrections is executed when the difference between the measurements and the substrate target characteristic is above a particular threshold.

18. The calibration method according to claim 17, wherein the sensitivity model is established by application of the same temperature set point variation separately and successively in each N heating zone, the other heating zones being maintained at their nominal set points.

* * * * *

UNITED STATES PATENT AND TRADEMARK OFFICE
CERTIFICATE OF CORRECTION

PATENT NO. : 9,805,969 B2  
APPLICATION NO. : 15/153509  
DATED : October 31, 2017  
INVENTOR(S) : Sebastien Mougel and Didier Masselin Page 1 of 1

It is certified that error appears in the above-identified patent and that said Letters Patent is hereby corrected as shown below:

In the Claims

Claim 6, Column 12, Line 48, change "matrix $G_I$ defined" to --matrix $G_{ij}$ defined--

Signed and Sealed this  
Twenty-third Day of January, 2018

Joseph Matal  
*Performing the Functions and Duties of the*  
*Under Secretary of Commerce for Intellectual Property and*  
*Director of the United States Patent and Trademark Office*